United States Patent [19]

Eisenhauer

[11] Patent Number: 5,184,063
[45] Date of Patent: Feb. 2, 1993

[54] THREE PHASE REVERSAL DETECTION SYSTEM

[75] Inventor: Virgil E. Eisenhauer, Camillus, N.Y.

[73] Assignee: Carrier Corporation, Syracuse, N.Y.

[21] Appl. No.: 834,748

[22] Filed: Feb. 13, 1992

[51] Int. Cl.$^5$ .................. G01R 25/00; H02H 3/18; H02H 3/26

[52] U.S. Cl. .................. 324/86; 324/108; 324/76.77; 361/76; 361/77; 361/85

[58] Field of Search ............ 324/86, 103 R, 108; 361/76, 77, 84, 85, 86

[56] References Cited

U.S. PATENT DOCUMENTS

| | | | |
|---|---|---|---|
| 3,848,160 | 11/1974 | Boothman et al. | 361/76 |
| 3,976,919 | 8/1976 | Vandevier et al. | 324/83 D |
| 3,999,087 | 12/1976 | Compton | 361/76 |
| 4,121,271 | 10/1978 | Tsai | 361/84 |
| 4,284,939 | 8/1981 | Kawada et al. | 361/77 |
| 4,333,119 | 6/1982 | Schoenmeyr | 361/76 |
| 4,636,720 | 1/1987 | Farr | 324/83 R |
| 4,802,053 | 1/1989 | Wojtak et al. | 361/86 |

Primary Examiner—Ernest F. Karlsen
Assistant Examiner—William J. Burns

[57] ABSTRACT

A polyphase reversal detection and correction system which operates over a wide range of line frequencies and produces an automatic phase correction for maintaining proper phase sequence to a rotating device. The system includes a circuit arrangement for developing peak integrated signals by comparing the relation of various input phases, and developing an integrated reference phase signal. The input phase signals and the reference phase signals are compared to determine and correct the input phase sequence.

3 Claims, 5 Drawing Sheets

THREE PHASE REVERSAL DETECTION SYSTEM

BACKGROUND OF THE INVENTION

1. Field of the Invention

The present invention relates generally to a method and apparatus for measuring phase difference between electrical wave forms of a polyphase alternating current signal for use with A. C. Motors or the like, and more particularly, to a phase reversal detection and correction circuit which would operate over a wide range of line frequencies and voltages to insure proper rotation of the motors or the like.

2. Description of the Prior Art

Prior art phase detectors employ bi-stable multi-vibrators or diode configurations with a plurality of transformers to measure the presence or absence of proper phase between incoming sine wave cycles and the required phase sequence of a driven polyphase device. Typically, such circuits operate at a single voltage and are unable to be detect when the incoming three phase power is out of phase if the frequency is not at a single setpoint.

SUMMARY OF THE INVENTION

Therefore, it is an object of the present invention to provide an improved phase reversal detection circuit which would operate over a wide range of input frequencies and voltages.

It is another object of the present invention to provide a phase reversal detection circuit which would detect phase reversal and automatically correct the phase reversal to maintain proper rotation of three phase devices.

These and other objects of the present invention are attained by a solid state detection device which generates an integrated signal which starts to integrate during the positive half cycle of the sine wave of the first incoming phase of the alternating line current when the sine wave of the second incoming phase of the alternating line current is in the negative half cycle of the sine wave, and which resets the integration of this integrated signal when the negative half cycle of the sine wave of the second incoming phase of the alternating line current starts the positive half cycle of the sine wave. The integrated signal is compared to a reference signal generated by the positive half cycle of the sine wave of one incoming phase of the alternating line current by a comparator which produces an output depending upon the relation between the reference signal and the integrated signal. The relation between the reference signal and the integrated signal is a function of the sequence of the phases of the incoming signal at the driven device.

BRIEF DESCRIPTION OF THE DRAWINGS

Still other objects and advantages of the present invention will be apparent from the following detailed description in conjunction with the accompanying drawings, in which reference numerals designate like or corresponding parts throughout the same, in which.

DESCRIPTION OF THE PREFERRED EMBODIMENT

Figure 1:
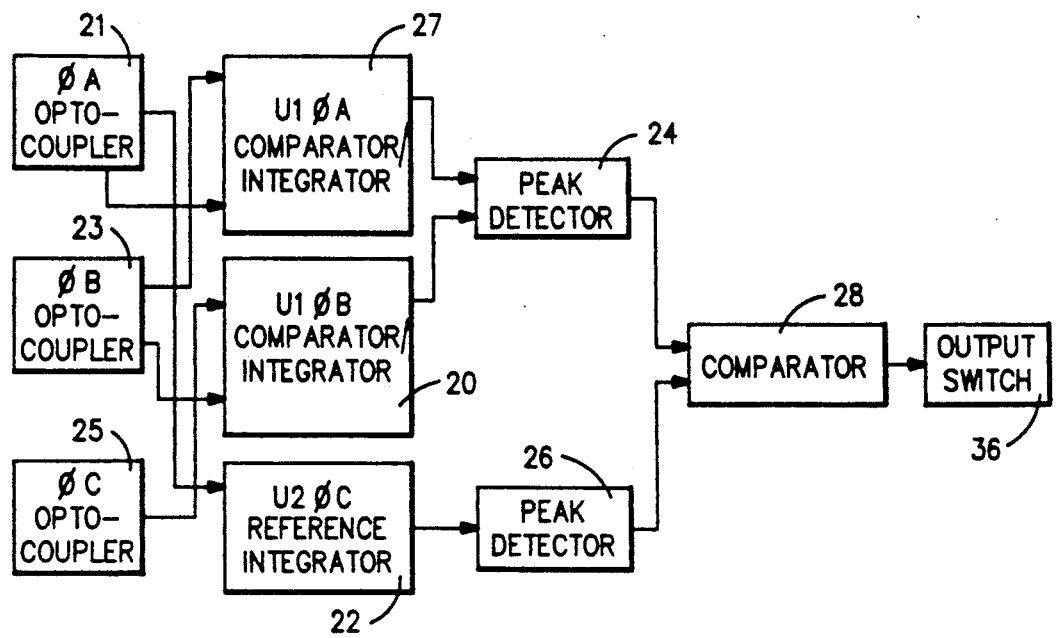
FIG. 1 is a block diagram of a three phase detection circuit according to the principles of the present invention.

Referring to FIG. 1, opto-couplers 21, 23, 25 each receive a single phase of the incoming polyphase alternating line current generally designated Phase A, Phase B, and Phase C which corresponds to the proper phase rotation of the driven device. The outputs of the opto-couplers are fed to comparator/integrators 27, 20 in the manner shown. Comparator/integrators 27, 20 integrate the output signals of the opto-couplers to a positive peak level. The outputs of the comparator/integrators 27, 20 are fed to peak detector 24. Opto-coupler 21 also provides a signal to reference integrator 22 which integrates to a positive peak level which varies with incoming line frequency. The output of the integrator 22 is fed to peak detector 26. The outputs of the two peak detectors 24, 26 are fed to a comparator 28 which compares the peak integrated amplitude of the input signals and provides an output signal if the incoming three phase power is out of phase.

Figure 2:
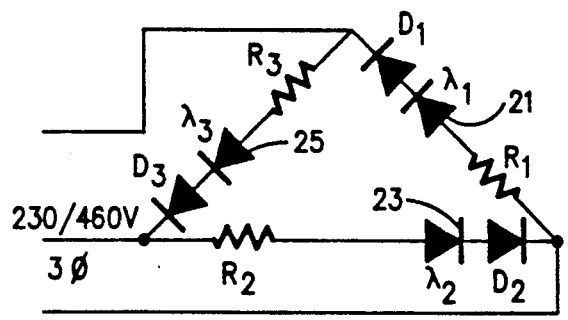
FIG. 2 is a schematic diagram of the optically coupled input for the three phase detection circuit of the present invention.
Figure 3:
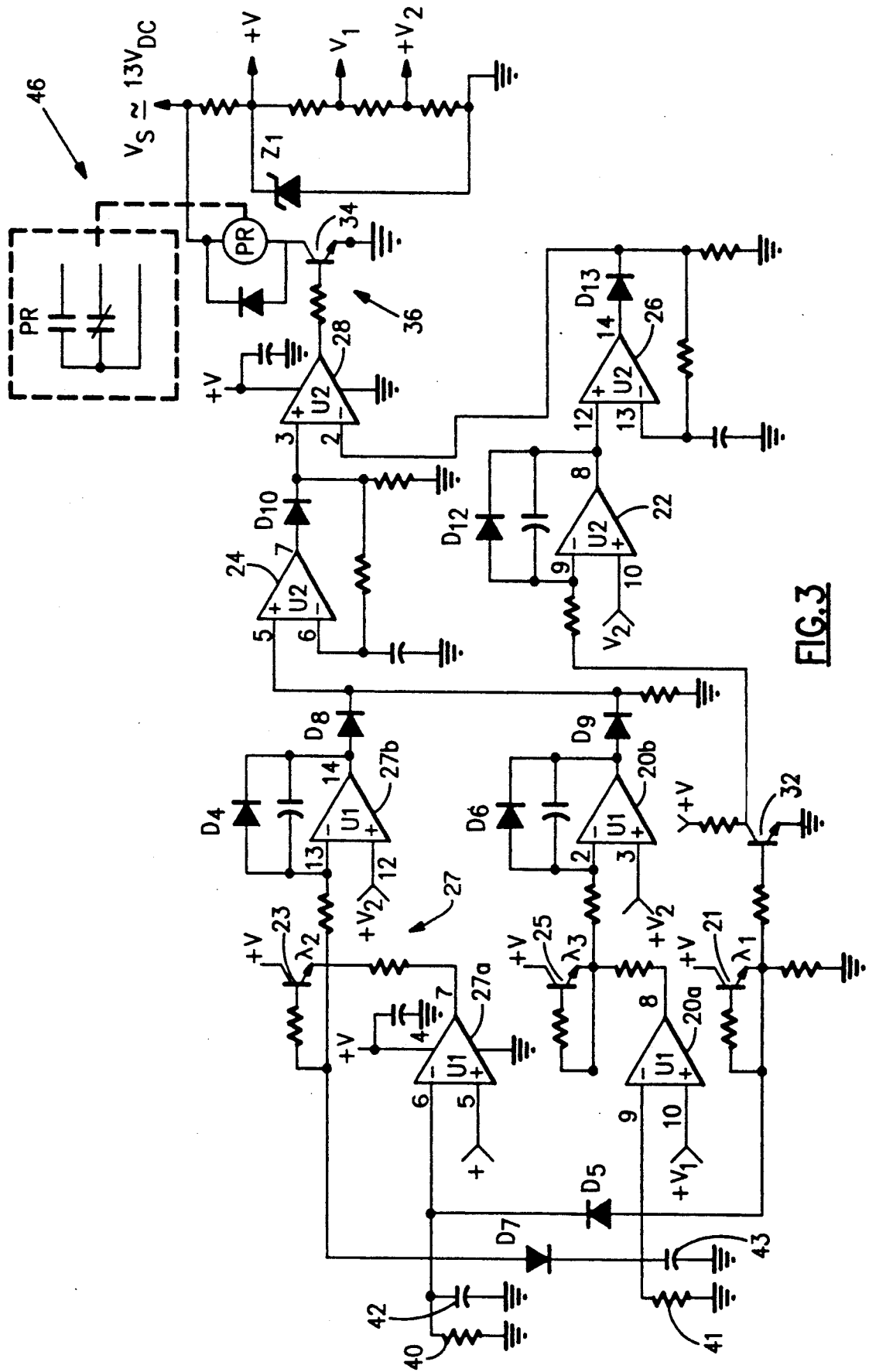
FIG. 3 is a schematic circuit diagram of a three phase detection circuit according to the principles of the present invention.

Referring now to FIGS. 2 and 3 for details of specific circuits which may be utilized for the phase reversal detection of the present invention, the circuits shown therein are arranged to monitor three phase power sources and include separate opto-couplers 21, 23, 25, respectively, for each of the three phases. Specifically, as shown in FIG. 3, when the input signal at opto-coupler 21 goes from the negative to the positive half cycle of the incoming sine wave, opto-coupler 21 is turned ON, which in turn turns ON transistor 32 and forces the output of the integrator 22 to integrate to a positive peak level or a high state, which is fed to peak detector 26 which in turn has an output that is the input reference voltage for comparator 28. When the incoming sine wave at opto-coupler 21 goes negative integrator 22 is reset to a low state.

When the opto-coupler 21 turns ON it also provides an input signal to comparator/integrator 27 (comprising comparator section 27a and integrator section 27b) which forces the output of the comparator/integrator 27 to integrate to a positive potential if the opto-coupler 23 is off, and continued to integrate until opto-coupler 23 is turned ON which forces the reset of the integrator section 27b of comparator/integrator 27 to a low state.

As the incoming sine wave signal at opto-coupler 23 goes from the negative to the positive half cycle opto-coupler 23 turns ON which also provides an input signal to comparator/integrator 20 (comprising comparator section 20a and integrator section 20b) which integrates to a positive DC level or a high state if the opto-couple 25 is off, and continues to integrate until opto-coupler 25 turns ON which forces the output of the integrator section 20b of comparator/integrator 20 to be reset to a low state. This positive peak level is fed to peak detector 24 which in turn provides a positive DC input signal to comparator 28. Comparator 28 compares the outputs of peak detectors 24, 26 and when the input phase sequence is proper, the output of the comparator 28 will be low and will hold transistor 34 of output switch 36 cut off.

If the incoming three phase power is out of phase the comparator/integrators 27, 20 will integrate to a higher potential by way of the RC time constant of the respective input resistors 40, 41 and capacitors 42, 43 which maintain the input voltage above the the reference input voltage on the respective comparators 27a, 20a. These inputs will keep the comparator/integrators 27, 20 functioning by way of a start signal from a single phase and a stop signal from the next phase in the proper sequence. With the integration process of the comparator/integrators 27, 20 taking longer, the input to the comparator 28 from the peak detector 24 will be at a higher potential then the input of comparator 28 from peak detector 26 and the transistor 34 of the output switch 36 will be turned ON and the phase reversal relay 46 will be energized. Upon energization of the phase reversal relay 46 two of the input phases can be reversed to an output device which puts the input phase sequence in proper phase.

Figure 4:
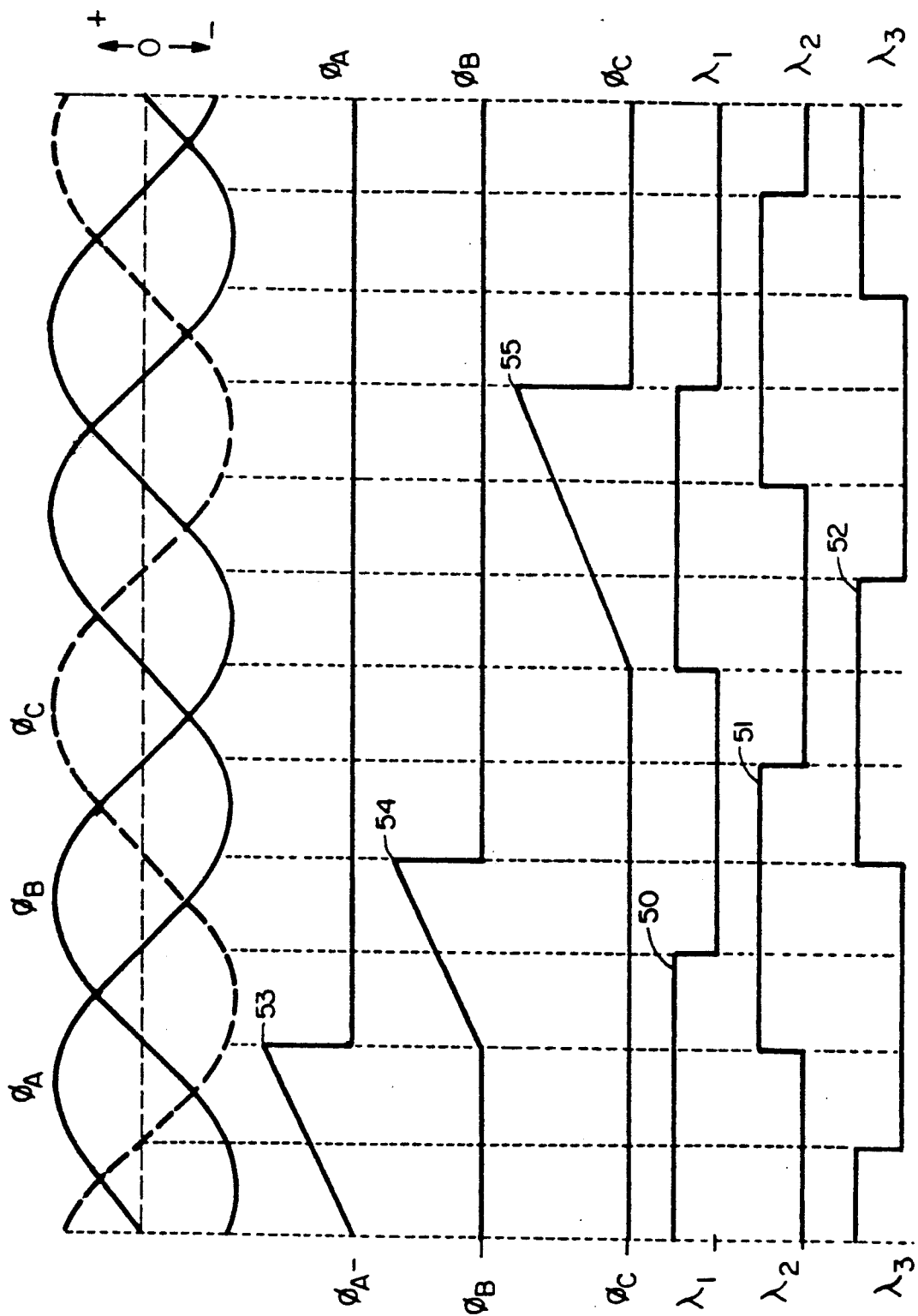
FIG. 4 illustrates the operational wave forms of the illustrated embodiment shown in FIG. 1 under conditions of proper phase rotation.

The operational waveforms of the three phase detection circuit of FIG. 3, when the incoming three phase power is "in-phase" is illustrated in FIG. 4. As shown the incoming three phases are designated Phase A($\Phi$A), Phase B($\Phi$B), and Phase C($\Phi$C) respectively. When the incoming phases go from the negative to the positive half cycle of the respective incoming sine waves the respective opto-couplers are turned ON to produce outputs 50, 51, 52 and allows comparator/integrators 27, 20 to integrate to a positive potential 53, 54 which is reset to zero by the leading edge of the square-wave output of the next incoming phase. When $\Phi$A goes from negative to the positive half cycle of the incoming sine wave $\Phi$A opto-coupler 21 generates a square-wave and also forces $\Phi$C reference integrator 22 to integrate to a higher positive peak level 55 than either $\Phi$A or $\Phi$B comparator/integrator outputs.

Figure 5:
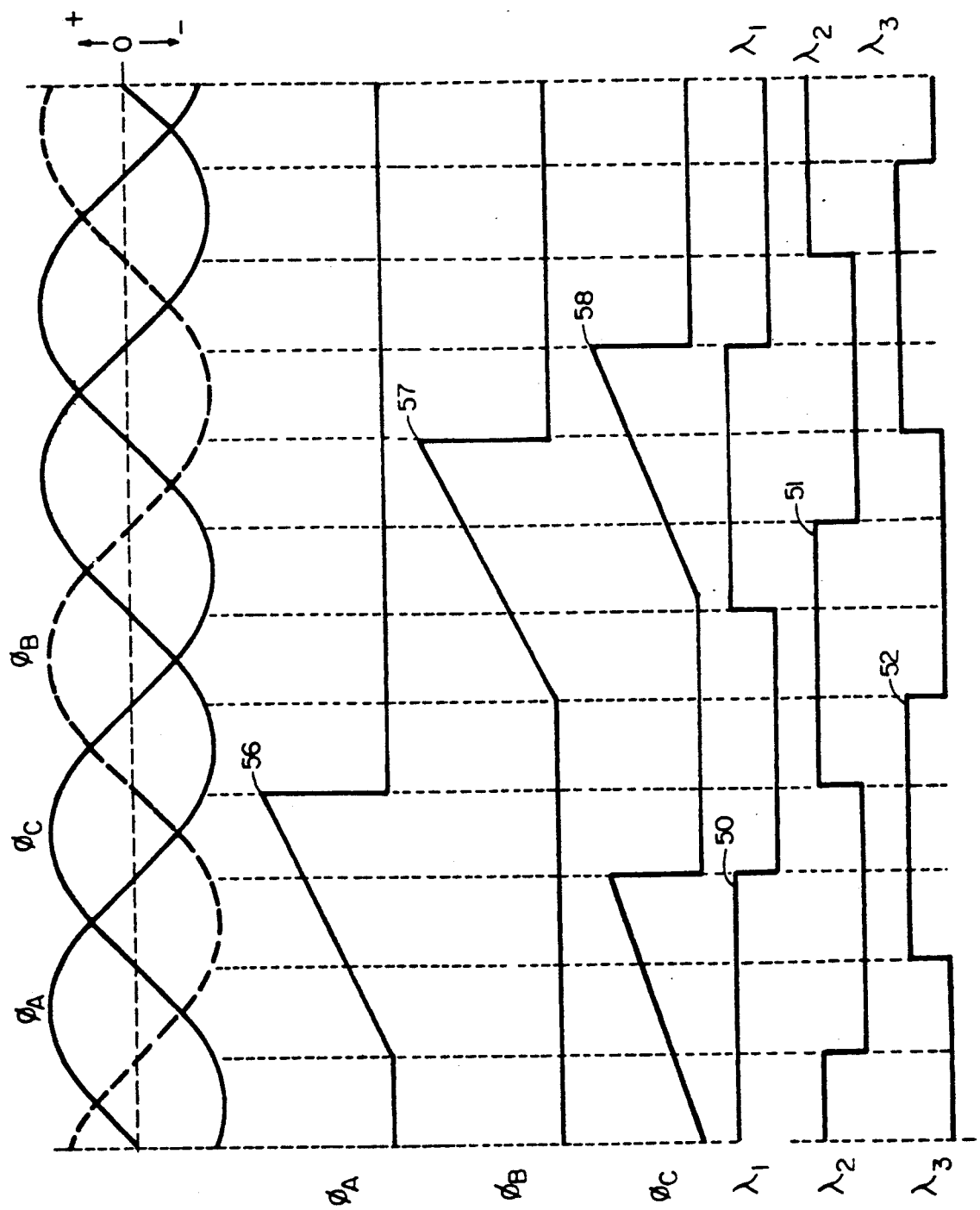
FIG. 5 illustrates operational wave forms of the illustrative embodiment shown in FIG. 1 when the incoming three phase power is out-of-phase.

Further, the operational wave forms of the three phase detection circuit, when the incoming three phase power is "out-of-phase" is illustrated in FIG. 5. As noted the comparator/integrators 27, 20 integrate to a higher positive potential 56, 57 than the output 58 of the reference integrator 22.

Figure 6:
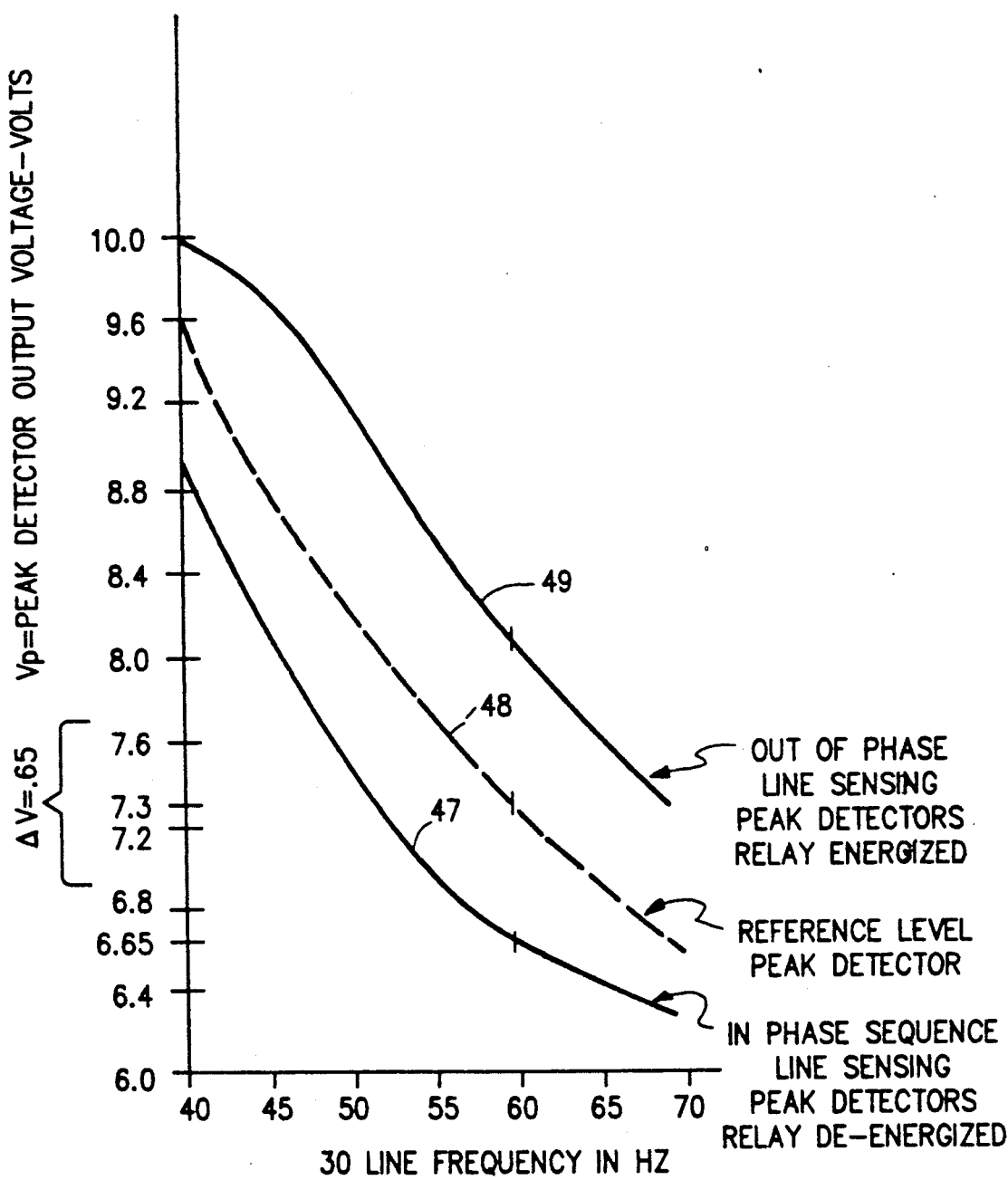
FIG. 6 illustrates wave forms of out-of-phase sequence, in-phase sequence and reference level of the illustrative embodiment shown in FIG. 1 over a wide range of frequencies.

The input 48 to the comparator 28 from the peak detector 26, and the inputs 47, 49 to the comparator 28 from the peak detector 24 when the incoming power is "in-phase" and "out-of-phase", respectively, over a wide range of frequencies, is shown in FIG. 6. Thus, the present invention provides polyphase detection over a wide frequency range.

While the present invention has been described in detail with reference to the illustrative embodiment; many modifications and variations would present themselves to those skilled in the art, for example, optical couplers may be replaced with direct coupled switches with departing from the true spirit and scope of the invention.

What is claimed is:

1. A polyphase line signal reversal detection system comprising:

at least first, second, and third input signal coupling means coupled to the polyphase line signal for generating respective output waveforms indicative of the input signals;

a first integrating circuit means having an integrating means coupled to said first and second input signal coupling means and responsive to the respective output waveforms for generating a first peak integrated signal, said first peak integrated signal is initiated during the positive half cycle of the first output waveform only when the second output waveform is in the negative half cycle and said first peak integrated signal is terminated when the second output waveform starts the positive half cycle;

a second integrating circuit means having an integrating means coupled to said second and third input signal coupling means and responsive to the respective output waveforms for generating a second peak integrated signal, said second peak integrated signal is initiated during the positive half cycle of the second output waveform only when the third output waveform is in the negative half cycle and said second peak integrated signal is terminated when the third output waveform starts the positive half cycle;

a reference integrating circuit means having an integrating means coupled to said first waveform coupling means and responsive to the first output for generating a reference integrated signal, said reference integrated signal is initiated at the start of the positive half cycle of the first output waveform and is terminated at the start of the negative half cycle of the first output waveform; and a comparator circuit means for comparing said first peak integrated signal, said second integrated signal, and said reference integrated signal, for providing an output indication signal of the phase sequence of the polyphase line signal.

2. A polyphase line signal reversal detection system as setforth in claim 1 further comprising a switch means responsive to said output indication signal of said comparator circuit means for switching at least two of the phase sequences when the polyphase line signal is out of sequence.

3. A polyphase line signal reversal detection system as setforth in claim 1 wherein said at least first, second, and third input signal coupling means includes an optical coupling means connected to respective phases of the polyphase line.

* * * * *